US012808927B2

(12) United States Patent
Yu et al.

(10) Patent No.: US 12,808,927 B2
(45) Date of Patent: Nov. 24, 2026

(54) SYSTEMS AND STRUCTURES FOR VENTING AND FLOW CONDITIONING OPERATIONS IN INSPECTION SYSTEMS

(71) Applicant: ASML Netherlands B.V., Veldhoven (NL)

(72) Inventors: Dongchi Yu, San Jose, CA (US); Erheng Wang, San Jose, CA (US); Jun-Li Lin, San Jose, CA (US); Shao-Wei Fu, San Jose, CA (US); Yi-Chen Lin, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 188 days.

(21) Appl. No.: 18/712,464

(22) PCT Filed: Oct. 28, 2022

(86) PCT No.: PCT/EP2022/080289
§ 371 (c)(1),
(2) Date: May 22, 2024

(87) PCT Pub. No.: WO2023/094113
PCT Pub. Date: Jun. 1, 2023

(65) Prior Publication Data

US 2025/0012855 A1 Jan. 9, 2025

Related U.S. Application Data

(60) Provisional application No. 63/283,188, filed on Nov. 24, 2021.

(51) Int. Cl.
*G01R 31/28* (2006.01)
*G01R 31/307* (2006.01)

(52) U.S. Cl.
CPC ........ *G01R 31/2881* (2013.01); *G01R 31/307* (2013.01)

(58) Field of Classification Search
CPC .............................. G01R 31/28; G01R 31/307
See application file for complete search history.

(56) References Cited

U.S. PATENT DOCUMENTS 6,120,606 A * 9/2000 Peng ...................... H01J 37/18 118/733
7,723,700 B2 5/2010 Horsky et al.
(Continued)

FOREIGN PATENT DOCUMENTS

JP H09158833 A 6/1997
JP 2014075412 A 4/2014
(Continued)

OTHER PUBLICATIONS

Zhang et al., "Particle resuspension in turbulent boundary layers and the influence of non-Gaussian removal forces," Elsevier Ltd., Journal of Aerosol Science, 58, (2013) 103-128 (26 pages).
(Continued)

*Primary Examiner* — Neel D Shah
(74) *Attorney, Agent, or Firm* — Finnegan, Henderson, Farabow, Garrett & Dunner LLP

(57) ABSTRACT

Systems and structures for venting and flow conditioning operations in charged particle beam systems. In some embodiments, a system may include a chamber configured to provide a vacuum environment; a vent valve; and a mass flow controller coupled to the chamber on a first side of the mass flow controller and to the vent valve on a second side of the mass flow controller.

17 Claims, 6 Drawing Sheets

(56) References Cited

U.S. PATENT DOCUMENTS

| | | | | |
|---|---|---|---|---|
| 8,302,420 | B2 * | 11/2012 | Wang .................... | H01J 37/185 62/306 |
| 2002/0148561 | A1 * | 10/2002 | Tetsuhiro ............ | H01J 37/3299 156/345.24 |
| 2008/0047607 | A1 | 2/2008 | Horsky et al. | |
| 2009/0061541 | A1 | 3/2009 | Moriya et al. | |
| 2012/0085941 | A1 | 4/2012 | Shibata | |
| 2012/0305188 | A1 | 12/2012 | Kato et al. | |
| 2015/0098084 | A1 | 4/2015 | Felts et al. | |

FOREIGN PATENT DOCUMENTS

| | | | |
|---|---|---|---|
| JP | 2016127025 | A | 7/2016 |
| JP | 6879663 | B2 | 6/2021 |
| TW | 201309106 | A | 2/2013 |
| WO | 2018073192 | A1 | 4/2018 |

OTHER PUBLICATIONS

Yu, et al., "Design of eScan 1100 venting structure—chamber and SEM vent box (CSVB)," Presented as poster in ASML technology conference 2021, hardware, 5.1 (1page).

Anonymous, "Systems and Structures for Venting and Flow Conditioning Operations in Inspection Systems", Research Disclosure, Kenneth Mason Publications, Hampshire, Uk, GB vol. 695, No. 19, Jan. 27, 2022 (32 pages).

PCT International Search Report, corresponding with a PCT Application No. PCT/EP2022/080289, mailed on Mar. 22, 2023. (3 pages).

* cited by examiner

500

SYSTEMS AND STRUCTURES FOR VENTING AND FLOW CONDITIONING OPERATIONS IN INSPECTION SYSTEMS

CROSS-REFERENCE TO RELATED APPLICATIONS

This application claims priority to International Application No. PCT/EP2022/080289, filed on 28 Oct. 2022, which claims priority of U.S. application 63/283,188, filed on 24 Nov. 2021. The contents of these applications are incorporated herein by reference in their entireties.

FIELD

The description herein relates to the field of systems and structures for venting and flow conditioning operations in charged particle beam systems, and more particularly to systems and structures that increase cleanliness and efficiency of venting and flow conditioning operations to maintain components and increase performance of inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments of the present disclosure provide systems and structures that increase cleanliness and efficiency of venting and flow conditioning operations to maintain components and increase performance of inspection systems. In some embodiments, a system may include a chamber configured to provide a vacuum environment; a vent valve; and a mass flow controller coupled to the chamber on a first side of the mass flow controller and to the vent valve on a second side of the mass flow controller.

In some embodiments, a flow-line arrangement may include a mass flow controller configured to: receive a gas from a vent valve, and provide the gas to a chamber configured to provide a vacuum environment.

In some embodiments, a flow-line arrangement may include a mass flow controller; a vent valve configured to provide a gas to the mass flow controller; and the mass flow controller is configured to provide the gas to a chamber configured to provide a vacuum environment.

In some embodiments, a method may include venting a chamber configured to provide a vacuum environment by: providing a gas to a vent valve; and providing the gas to a mass flow controller, wherein the mass flow controller is coupled to the chamber on a first side of the mass flow controller and to the vent valve on a second side of the mass flow controller.

In some embodiments, a non-transitory computer readable medium may store a set of instructions that is executable by at least one processor of a computing device to cause the computing device to perform a method, the method comprising venting a chamber configured to provide a vacuum environment by: providing a gas to a vent valve; and providing the gas to a mass flow controller, wherein the mass flow controller is coupled to the chamber on a first side of the mass flow controller and to the vent valve on a second side of the mass flow controller.

DETAILED DESCRIPTION

Figure 1:
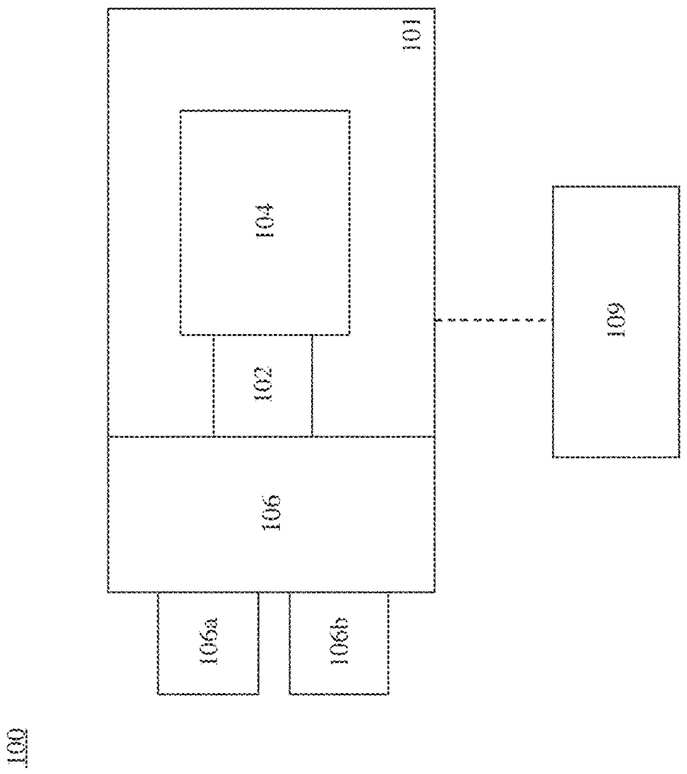
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, extreme ultraviolet inspection, deep ultraviolet inspection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur. Defects may be generated during various stages of semiconductor processing. For the reason stated above, it is important to find defects accurately and efficiently as early as possible.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture." an electron beam may be provided onto the structures, and when the electrons are reflected or emitted ("exiting") from the structures, a detector of the SEM may receive and record the energies or quantities of those electrons to generate an image. To take such a "picture." some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures." resulting in more electrons exiting from the structures. Accordingly, the detector may receive more exiting electrons simultaneously, and generate images of the structures of the wafer with a higher efficiency and a faster speed.

An inspection system may operate in a vacuum chamber environment. The chamber is in an inspection system that operates in a vacuum environment require clean and efficient venting and flow conditioning operations (e.g., hot gas treatment, purging, overpressure, etc.) to maintain the components and increase the performance of the inspection system. For example, a chamber may be vented (e.g., the pressure of the chamber may be adjusted from a vacuum pressure to atmospheric pressure) to perform various processes in an inspection system, such as placing or removing a sample in the inspection system.

Existing flow-supply structures, however, suffer from constraints. Existing flow-supply structures typically adopt a distributed layout of venting structures for vacuum chambers scattered around a platform to supply the vacuum chambers with the required gas flow. In a distributed layout of venting structures, a separate system for each vacuum chamber may be used to vent each vacuum chamber. This existing distributed layout lacks regulation of pressure changes in vacuum chambers and, consequently, lack regulation of the venting flow in vacuum chambers. Consequently, pressure variation in existing vacuum chambers during venting is substantial and results in flow-induced turbulence and disturbance of particles in the system. The disturbance of particles in a system results in particle contamination and cross-component damage in the system. Existing flow-supply structures also typically lack additional flow conditioning capabilities.

Moreover, the flow line arrangement in existing flow-supply structures is typically not optimized for high or ultra-high vacuum chambers. Existing flow-supply structures are typically designed for large chambers with low vacuum pressure (e.g., around 0.1 Torr). However, these existing flow-supply structures typically fail to meet the stringent requirements of inspection systems (e.g., electron beam inspection systems). For example, inspection systems typically require high or ultra-high vacuum chambers with a high vacuum seal, granular flow control, small volume, or various flow conditioning for stable machine performance.

As a result, existing flow-supply structures with distributed layout of venting structures fail to provide adequate control over the venting flow to vacuum chambers, which may damage or contaminate the components in an inspection structure (e.g., components in a SEM chamber, components, in a main chamber, etc.). Moreover, the lack of adequate control over the flow supply due to the distributed layout of existing flow-supply structures results in flow conditioning operations for proper machine conditioning failing to be implemented in systems.

Some of the disclosed embodiments provide systems and structures that address some or all of these disadvantages by providing flow-supply structures that provide integrated venting and flow conditioning operations to chambers in an inspection system. A pre-defined resuspension-suppressed venting profile may be used in the flow-supply structures disclosed herein to limit particle resuspension in the system, thereby providing a controlled, efficient, and clean venting sequence for one or more chambers in the inspection system and reducing particle contamination and cross-component damage in the inspection system. Clean and efficient venting in the system may also be achieved with a modified flow-line layout that enables additional gas treatment modules to be easily installed and swapped out for various flow conditioning operations in the system.

Relative dimensions of components in drawings may be exaggerated for clarity. Within the following description of drawings, the same or like reference numbers refer to the same or like components or entities, and only the differences with respect to the individual embodiments are described.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Although the terms "left," "right." "horizontal," "up." "down," "vertical," etc., may be used herein to describe directions and orientations of various elements, these elements should not be limited by these terms. These terms are used to describe exemplary systems or operations of systems from exemplary perspectives. For example, a direction "up" from one perspective could be a direction "down" from another perspective, and, similarly, a direction "down" from one perspective could be a direction "up" from another perspective, without departing from the scope of the embodiments.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1. EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106*a* and a second loading port 106*b*. EFEM 106 may include additional loading port (s). First loading port 106*a* and second loading port 106*b* receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
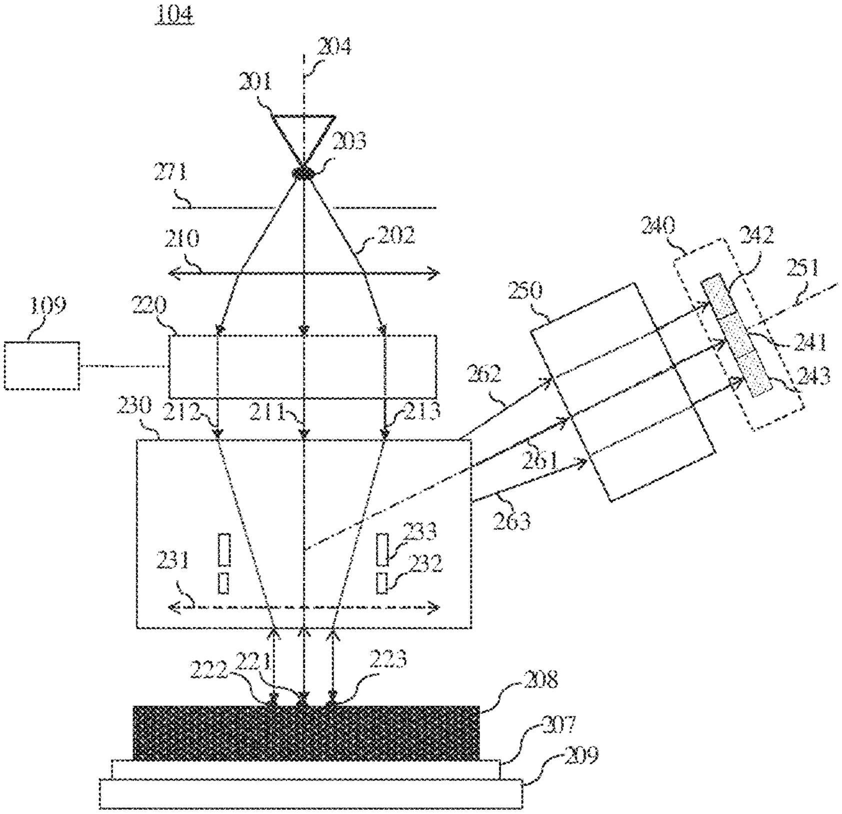
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principal plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104. In some embodiments, apparatus 104 may be a SEM used for lithography.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries, adapting to different throughputs and resolution requirements.

Figure 3A:
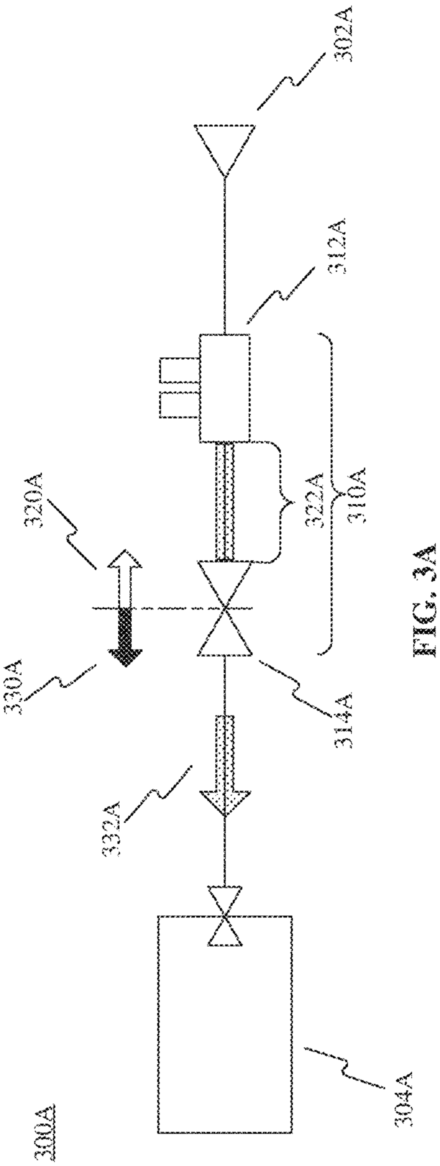
FIG. 3A illustrates an exemplary flow-line arrangement.

FIG. 3A illustrates a system 300A with an exemplary flow-line arrangement 310A. A flow-line arrangement 310A is often used to provide gas to a chamber.

System 300A may include a gas supply 302A that provides gas to flow-line arrangement 310A. The gas provided by gas supply 302A may be regulated by flow-line arrangement 310A to be provided to a chamber 304A (e.g., a vacuum chamber). Flow-line arrangement 310A may include a mass flow controller 312A and a vent valve 314A, where mass flow controller 312A is upstream of vent valve 314A (i.e., a distance between mass flow controller 312A and gas supply 302A is less than a distance between vent valve 314A and gas supply 302A). Mass flow controller 312A may include a valve and may provide the gas provided by gas supply 302A to vent valve 314A at a specific flow rate.

When vent valve 314A is closed, vent valve 314A may provide a vacuum seal. However, mass flow controller 312A does not provide a vacuum seal when it is closed. Therefore, even when vent valve 314A and mass flow controller 312A are closed, gas (e.g., air) leaks through mass flow controller 312A and accumulate in region 322A between vent valve 314A and mass flow controller 312A. This accumulated gas in region 322A exists in a high pressure environment 320A between vent valve 314A and mass flow controller 312A while the vacuum seal of vent valve 314A provides a vacuum environment 330A in chamber 304A.

System 300A may require venting and flow conditioning operations (e.g., hot gas treatment, purging, overpressure, etc.) to be performed to maintain the components and increase the performance of an inspection system in system 300A. Venting and flow conditioning operations may require mass flow controller 312A and vent valve 314A to be opened to supply gas to chamber 304A.

Flow-line arrangement 310A may suffer from constraints in performing venting or flow conditioning operations in system 300A. For example, due to the high pressure difference between high pressure environment 320A and vacuum environment 330A provided by accumulated gas in region 322A, the accumulated gas may burst downstream (e.g., towards chamber 304A) when vent valve 314A is opened for venting or flow conditioning operations, providing a detrimentally strong gas flow 332A. That is, the accumulated gas may provide a sudden pressure increase downstream, including in chamber 304A, resulting in lack of regulation of pressure changes in chamber 304A and, consequently, lack of regulation of venting flow in chamber 304A. For example, the sudden pressure increase downstream renders mass flow controller 312A useless (e.g., the flow rate of the gas downstream will not be equal to the flow rate set by mass flow controller 312A).

The sudden pressure increase downstream also causes substantial flow-induced disturbance (e.g., turbulence) in system 300A, including in chamber 304A, thereby disturbing particles in system 300A and chamber 304A (e.g., causing particles on surfaces of system 300A to leave surfaces and resuspend) and diffusing the particles throughout system 300A. The disturbance of particles in system 300A and chamber 304A results in particle contamination and cross-component damage in system 300A. Moreover, system 300A lacks additional flow conditioning capabilities (e.g., hot gas treatment, purging, overpressure, etc.) that are required to maintain the components and increase the performance of system 300A.

The sudden high pressure effect is exacerbated when a higher flow rate for venting is required for system 300A. In some cases, the flow rate of the gas may be limited to avoid flow-induced disturbance in system 300A during venting. However, limiting the flow rate of the gas during venting is inefficient. Moreover, system 300A does not account for the pressure of chamber 304A during its venting and flow conditioning operations, thereby further reducing the cleanliness and efficiency of these operations in system 300A.

Figure 3B:
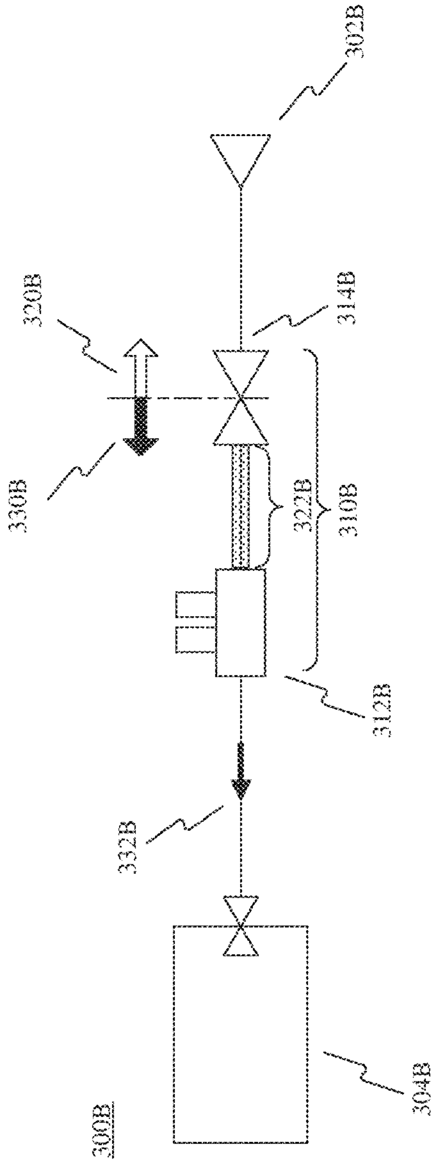
FIG. 3B illustrates an exemplary flow-line arrangement, consistent with embodiments of the present disclosure.

FIG. 3B illustrates a system 300B with an exemplary flow-line arrangement 310B, consistent with embodiments of the present disclosure.

Figure 4:
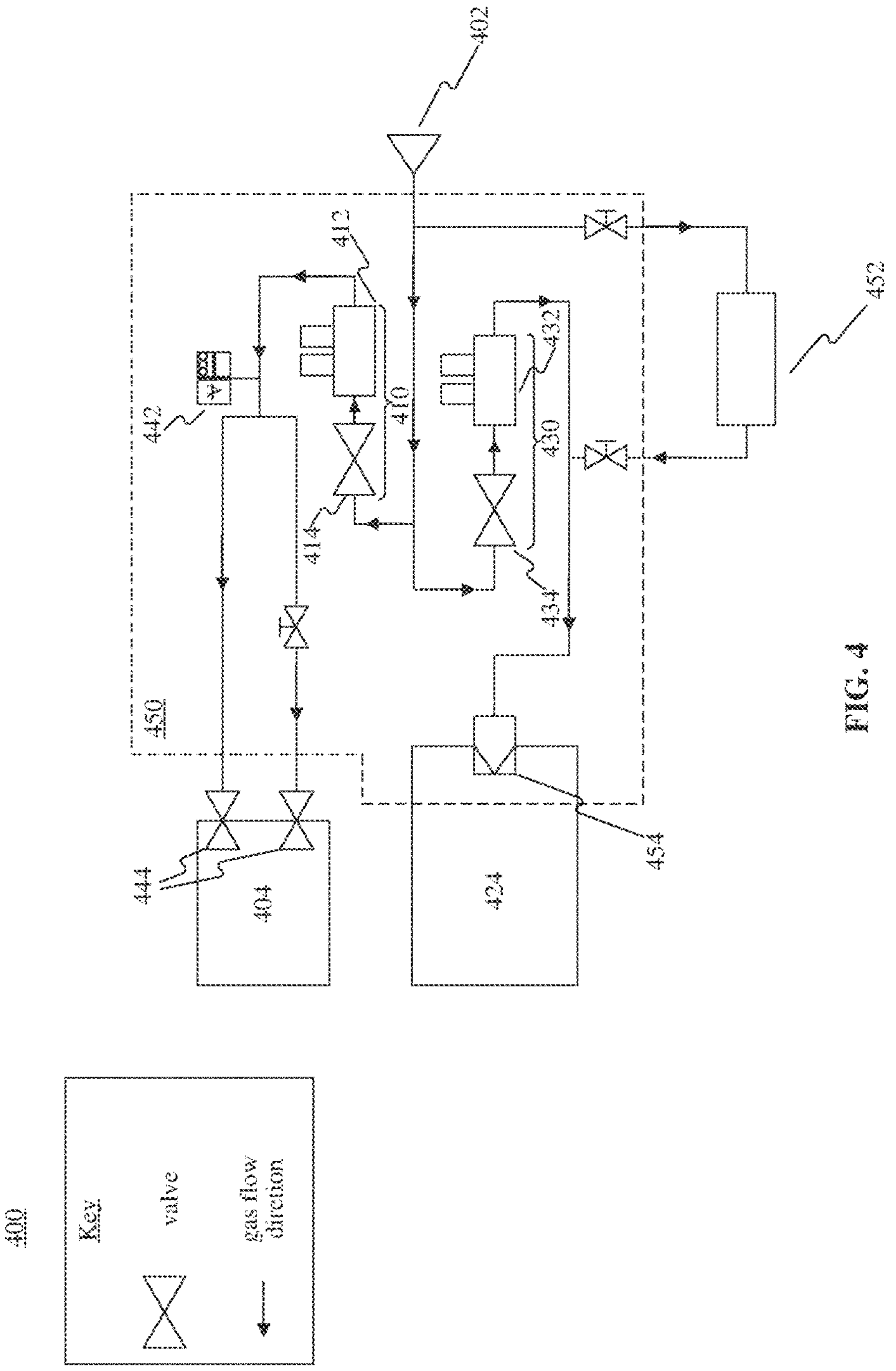
FIG. 4 illustrates an exemplary system including the exemplary flow-line arrangement of FIG. 3B, consistent with embodiments of the present disclosure.

System 300B may include a gas supply 302B (e.g., gas supply 402 of FIG. 4, etc.) that provides gas to flow-line arrangement 310B (e.g., flow-line arrangement 410 of FIG. 4, flow-line arrangement 430 of FIG. 4, etc.). The gas provided by gas supply 302B may be regulated by flow-line arrangement 310B to be provided to a chamber 304B (e.g., a vacuum chamber, a SEM chamber main chamber 101 of FIG. 1, load-lock chamber 102 of FIG. 1, chamber 404 of FIG. 4, chamber 424 of FIG. 4, etc.). Flow-line arrangement 310B may include a mass flow controller 312B (e.g., mass flow controller 412 of FIG. 4, mass flow controller 432 of FIG. 4, etc.) and a vent valve 314B (e.g., vent valve 414 of FIG. 4, vent valve 434 of FIG. 4, etc.), where mass flow controller 312B is downstream of vent valve 314B (e.g., a distance between mass flow controller 312B and gas supply 302B is greater than a distance between vent valve 314B and gas supply 302B). Mass flow controller 312B may include a valve and may provide the gas provided by gas supply 302A and vent valve 314A to chamber 304B at a specific flow rate.

When vent valve 314B is closed, vent valve 314B may provide a vacuum seal such that vacuum environment 330A exists when vent valve 314B is closed. Since vent valve 314B is upstream of mass flow controller 312B, there is no accumulated gas in high pressure environment 320B or in region 322B between mass flow controller 312B and vent valve 314B.

System 300B may require venting and flow conditioning operations (e.g., hot gas treatment, purging, overpressure, etc.) to be performed to maintain the components and increase the performance of an inspection system in system 300B. Venting and flow conditioning operations may require mass flow controller 312B and vent valve 314B to be opened to supply gas to chamber 304B.

Since there is no accumulated gas in system 300B when flow-line arrangement 310B is closed, there is no sudden high pressure burst of gas downstream when flow-line arrangement 310B is opened. Instead, mass flow controller 312B may provide a controlled flow of gas 332B at a set flow rate. In some embodiments, mass flow controller 312B may adjust a mass flow rate of gas supplied by gas supply 302B to adjust a pressure in chamber 304B, which may vary depending on the application.

Figure 5:
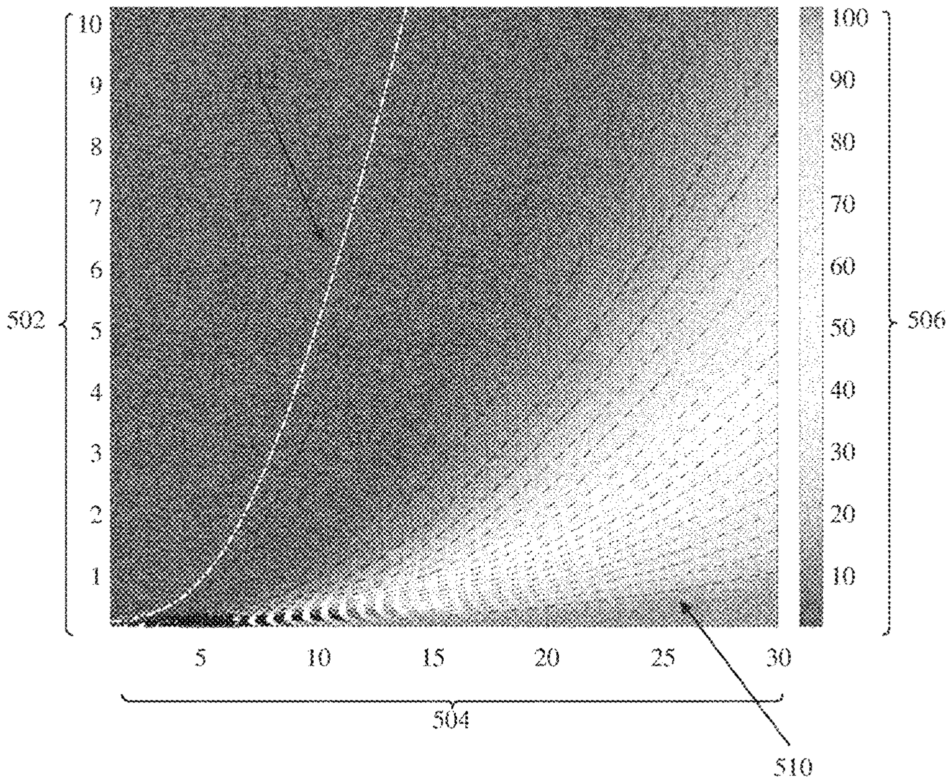
FIG. 5 illustrates an exemplary contour map of particle resuspension rate as a function of flow rate and pressure, consistent with embodiments of the present disclosure.
Figure 6:
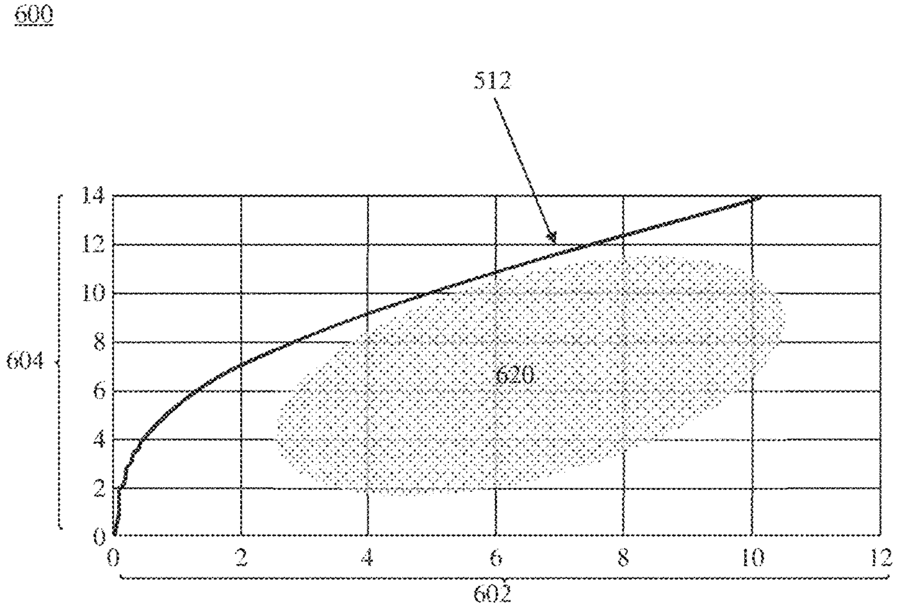
FIG. 6 illustrates an exemplary graph of a flow rate and pressure profile for a range of particle resuspension rates, obtained from the exemplary contour map of FIG. 5, consistent with embodiments of the present disclosure.

In some embodiments, depending on the venting or flow conditioning operations, flow-line arrangement 310B may regulate gas supplied to chamber 304B according to a pre-set flow profile (e.g., flow profiles of contour map 500 of FIG. 5, flow profile of graph 600 of FIG. 6, etc.). In some embodiments, regulating gas may include adjusting a flow rate of the gas and monitoring a pressure of the gas (e.g., a pressure of the gas inside chamber 304B). For example, a pre-set flow profile of the gas may include parameters (e.g., a flow rate of the gas, a pressure inside chamber 304B, etc.) that flow-line arrangement 310B uses to regulate the gas such that a resuspension rate of particles in system 300B remains below a selected limit. For example, a resuspension rate of 0.1% may be achieved throughout a venting process where the venting process restores a chamber pressure from a deep vacuum level to an atmospheric level. In some embodiments, a resuspension rate of 0.1% may be achieved at a vacuum pressure less than or equal to $10\times10^{-7}$ Torr, the pressure range at which a SEM may operate. For example, flow-line arrangement 310B may be used to limit a particle resuspension rate to less than 0.1% when chamber 304B is vented or over-pressured.

A resuspension rate of particles may be the percentage of total particles attached to the surface initially that are resuspended from the surface (e.g., the percentage of total particles attached to the surface initially that leave the surface). In some embodiments, a particle resuspension rate limit may be determined based on system 300B or based on operations performed in system 300B (e.g., some configurations of system 300B may require less resuspension of particles to avoid contamination or damage in the system while other configurations of system 300B may be able to tolerate more resuspension of particles).

In some embodiments, mass flow controller 312B may operate under a feedback loop such that a pressure sensor downstream (e.g., a pressure sensor in chamber 304B) may detect a pressure and communicate the pressure to mass flow controller 312B. Mass flow controller 312B may adjust a flow rate of the gas based on the pre-set flow profile of the gas (e.g., mass flow controller 312B may adjust the flow rate of the gas if a pressure of chamber 304B is inconsistent with the pre-set flow profile) so that the gas flow and chamber 304B are consistent with the pre-set flow profile.

Flow-induced disturbance in system 300B can be greatly attenuated (e.g., avoided) due to the elimination of sudden high pressure burst of gas downstream. Therefore, mass flow rate controller 312B may accurately set a flow rate of gas supplied by gas supply 302B such that particle disturbance and particle resuspension in system 300B are limited, thereby limiting particle contamination and cross-component damage in system 300B and increasing cleanliness and efficiency of venting and flow conditioning operations in system 300B.

FIG. 4 illustrates an exemplary system 400 including the exemplary flow-line arrangement of FIG. 3B, consistent with embodiments of the present disclosure.

System 400 may include an integrated flow supply system 450 including one or more flow-line arrangements (e.g., flow-line arrangement 310B of FIG. 3B, etc.), such as flow-line arrangement 410 and flow-line arrangement 430. Flow supply system 450 may have a centralized flow regulation that controls gas flow to a flow-line arrangement and a corresponding chamber. For example, flow supply system 450 may regulate gas flow into flow-line arrangement 410 and a corresponding chamber 404 (e.g., a SEM chamber, main chamber 101 of FIG. 1, load-lock chamber 102 of FIG. 1, chamber 304B of FIG. 3B, a chamber configured to provide a vacuum environment, etc.). Flow supply system 450 may regulate gas flow into flow-line arrangement 430 and a corresponding chamber 424 (e.g., a SEM chamber, main chamber 101 of FIG. 1, load-lock chamber 102 of FIG. 1, chamber 304B of FIG. 3B, a chamber configured to provide a vacuum environment, etc.). While only two chambers are illustrated, it should be understood that flow supply system 450 may include any number of chambers. The one or more chambers of flow supply system 450 may be any size. In some embodiments, each chamber in flow supply system 450 may have its own corresponding flow-line arrangement (e.g., a corresponding mass flow controller, a corresponding vent valve, etc.). In some embodiments, flow supply system 450 may be configured to each flow-line arrangement corresponding to a chamber such that the gas flow into each chamber may be adjusted independently of the gas flow into another chamber. For example, flow supply system 450 may be configured to adjust a pressure of each chamber by adjusting a flow rate of a gas provided into each chamber.

In some embodiments, chamber 404 may include one or more valves 444 to further control gas flow into chamber 404. While chamber 404 is illustrated as including one or more valves 444, it should be understood that in some embodiments, chamber 404 may not include one or more valves 444 or chamber 424 may include one or more valves 444. In some embodiments, pressure sensor 442 may be configured to detect a pressure of a gas downstream of flow-line arrangement 410. It should be understood that in some embodiments, one or more pressure sensors may be positioned upstream or downstream of one or more flow-line arrangements. In some embodiments, one or more chambers may include pressure sensors configured to measure the pressure inside each chamber. In some embodiments, pressure sensors inside one or more chambers or positioned elsewhere in system 400 may be configured to communicate with one or more flow-line arrangements.

System 400 may include a gas supply 402 that provides gas (e.g., air, etc.) to flow supply system 450. In some embodiments, more than one gas supply may provide gas to flow supply system 450. Flow supply system 450 may control the gas provided by gas supply 402 to provide the gas to one or more flow-line arrangements (e.g., flow-line arrangement 410, flow-line arrangement 430, etc.). As an example, gas from gas supply 402 may be regulated by flow-line arrangement 430 to be provided to chamber 424. Flow-line arrangement 430 may include a mass flow controller 432 (e.g., mass flow controller 312B of FIG. 3B, etc.) and a vent valve 434 (e.g., vent valve 314B of FIG. 3B, etc.), where mass flow controller 432 is downstream of vent valve 434 (e.g., a distance between mass flow controller 432 and gas supply 402 is greater than a distance between vent valve 434 and gas supply 402). It should be understood that the following description of flow-line arrangement 430, gas supply 402, and chamber 424 may also be applied to flow-line arrangement 410, gas supply 402, and chamber 404. For example, flow-line arrangement 410 may include a mass flow controller 412 (e.g., mass flow controller 312B of FIG. 3B, etc.) and a vent valve 414 (e.g., vent valve 314B of FIG. 3B, etc.), where mass flow controller 412 is downstream of vent valve 414. Mass flow controller 432 may include a valve and may provide the gas provided by gas supply 402 and vent valve 434 to chamber 424 at a specific flow rate.

When vent valve 434 is closed, vent valve 434 may provide a vacuum seal such that a vacuum environment (e.g., vacuum environment 330B of FIG. 3B, etc.) exists between vent valve 434 and chamber 424 when vent valve 434 is closed. Since vent valve 434 is upstream of mass flow controller 432, there is no accumulated gas in between vent valve 434 and gas supply 402 (e.g., high pressure environment 320B of FIG. 3B, etc.) and no accumulated gas in between vent valve 434 and mass flow controller 432 (e.g., region 322B of FIG. 3B, etc.).

System 400 may require venting and flow conditioning operations (e.g., hot gas treatment, purging, overpressure, etc.) to be performed to maintain the components and increase the performance of an inspection system in system 400. Venting and flow conditioning operations may require mass flow controller 432 and vent valve 434 to be opened to supply gas to chamber 424.

Since there is no accumulated gas in system 400 when flow-line arrangement 430 is closed, there is no sudden high pressure burst of gas downstream when flow-line arrangement 430 is opened. Instead, mass flow controller 432 may provide a controlled flow of gas (e.g., controlled flow of gas 332B of FIG. 3B, etc.) at a set flow rate. In some embodiments, mass flow controller 432 may adjust a mass flow rate of gas supplied by gas supply 402 to adjust a pressure in chamber 424, which may vary depending on the application.

In some embodiments, depending on the venting or flow conditioning operations, flow-line arrangement 430 may regulate gas supplied to chamber 424 according to a pre-set flow profile (e.g., flow profiles of contour map 500 of FIG. 5, flow profile of graph 600 of FIG. 6, etc.). In some embodiments, regulating gas may include adjusting a flow rate of the gas and monitoring a pressure of the gas (e.g., a pressure of the gas inside chamber 424). For example, a pre-set flow profile of the gas may include parameters (e.g., a flow rate of the gas, a pressure inside chamber 424, etc.) that flow-line arrangement 430 uses to regulate the gas such that a resuspension rate of particles in system 400 remains below a selected limit. For example, a resuspension rate of 0.1% may be achieved throughout a venting process where the venting process restores a chamber pressure from a deep vacuum level to an atmospheric level. In some embodiments, a resuspension rate of 0.1% may be achieved at a vacuum pressure less than or equal to $10\times10^{-7}$ Torr, the pressure range at which a SEM may operate. For example, flow-line arrangement 430 may be used to limit a particle resuspension rate to less than 0.1% when chamber 424 is vented or over-pressured.

A resuspension rate of particles may be the percentage of total particles attached to the surface initially that are resuspended from the surface (e.g., the percentage of total particles attached to the surface initially that leave the surface). In some embodiments, a particle resuspension rate limit may be determined based on system 400 or based on operations performed in system 400 (e.g., some configurations of system 400 may require less resuspension of particles to avoid contamination or damage in the system while other configurations of system 400 may be able to tolerate more resuspension of particles). In some embodiments, a particle resuspension rate limit may be determined based on one or more chambers (e.g., chamber 404 or 424) or based on operations performed in one or more chambers.

In some embodiments, mass flow controller 432 may operate under a feedback loop such that a downstream pressure sensor (e.g., a pressure sensor in chamber 424) may detect a pressure and communicate the pressure to mass flow controller 432. Mass flow controller 432 may adjust a flow rate of the gas based on the pre-set flow profile of the gas (e.g., mass flow controller 432 may adjust the flow rate of the gas if a pressure of chamber 424 is inconsistent with the pre-set flow profile) so that the gas flow and chamber 424 are consistent with the pre-set flow profile.

Flow-induced disturbance in system 400 can be greatly attenuated (e.g., avoided) due to the elimination of sudden high pressure burst of gas downstream. Therefore, mass flow rate controller 432 may accurately set a flow rate of gas supplied by gas supply 402 such that flow-induced disturbance and particle resuspension in system 400 (e.g., in chambers 404 or 424) are limited, thereby limiting particle contamination and cross-component damage in system 400 and increasing cleanliness and efficiency of venting and flow conditioning operations in system 400.

In some embodiments, chamber 404 may be a SEM chamber for a SEM module, where the SEM module may generate an electron beam for inspection. In some embodiments, chamber 424 may be a main chamber (e.g., main chamber 101 of FIG. 1) where many operations of inspection of a sample (e.g., sample 208 of FIG. 2) may occur. In some embodiments, system 400 may include a load-lock chamber (e.g., load-lock chamber 102 of FIG. 1), where a sample may be prepared (e.g., thermally stabilized) for inspection in a main chamber. While chamber 404 and chamber 424 are illustrated as separate components, in some embodiments, chambers 404 and 424 may be interconnected (e.g., share a path) such that gas may transfer between chambers 404 and 424 and chambers 404 and 424 may have the same pressure. In some embodiments, chambers 404 and 424 may have the same vacuum environment. In some embodiments, chambers 404 and 424 may not be connected or may have different pressures.

In some embodiments, system 400 may include one or more gas treatment modules 452 that may perform flow conditioning operations (e.g., hot gas treatment, purging, overpressure, etc.) to maintain the components and increase the performance of system 400. In some embodiments, gas treatment module 452 may be included in a different position of system 400 than the position depicted. In some embodiments, gas treatment module 452 may include one or more inlets or outlets (not shown in FIG. 4) that supply or flush out gas. Gas treatment module 452, and components thereof, may be conveniently swapped out of system 400 for different applications in system 400 (e.g., by swapping out gas hose interfaces, etc.).

In some embodiments, gas treatment module 452 may adjust a characteristic of a gas to be supplied to a chamber (e.g., chambers 404 or 424). In some embodiments, the characteristic of the gas may indicate a temperature of the gas. For example, gas treatment module may supply a heated gas to a chamber to increase a temperature of a gas inside a chamber (e.g., supply super-heated gas). In some embodiments, gas treatment module may heat a gas supplied by gas supply 402. For example, gas treatment module 452 may heat a gas before the gas is provided to a flow-line arrangement. In some embodiments, gas treatment module 452 may heat a gas after it passes through a flow-line arrangement and before it is supplied to a chamber. In some embodiments, gas treatment module 452 may adjust a temperature of a gas to purify system 400 (e.g., gas lines, chamber 404 or 424, etc.) to reduce contamination (e.g., to bake off organic contamination) and increase performance of system 400 (e.g., an inspection system).

In some embodiments, the characteristics of the gas may indicate a mixture of gas. For example, gas treatment module 452 may supply a purge gas (e.g., nitrogen, helium etc.) to clean a chamber or system. In some embodiments, gas treatment module 452 may supply a gas to a chamber concurrently with a gas supplied to the chamber by gas supply 402.

In some embodiments, gas treatment module may supply a gas to be mixed with a gas provided by gas supply 402. In some embodiments, the gases may be mixed before being provided to a flow-line arrangement. In some embodiments, gas treatment module 452 may supply a gas to be mixed with a gas supplied by gas supply 402 after the gas supplied by gas supply 402 passes through a flow-line arrangement.

It should be understood that the above-described examples of gas treatment module 452 are not limited to the described examples and that any gas treatment may be used in system 400 for various applications.

In some embodiments, one or more chambers, such as chamber 424, may include a diffuser 454. Diffuser 454 may be provided at an inlet of chamber 424 and may include a filter. For example, diffuser 454 may filter out particles in the gas to further provide a clean gas to chamber 424. In some embodiments, diffuser 454 may reduce a flow rate of the gas and spread out the flow of the gas into chamber 424, thereby reducing turbulence in the gas and reducing the number of particles disturbed in chamber 424. Diffuser 454 may limit a particle resuspension rate in system 400, including chamber 424 (e.g., particle resuspension rate of less than 0.1%).

FIG. 5 illustrates an exemplary contour map 500 of particle resuspension rate as a function of flow rate and pressure, consistent with embodiments of the present disclosure.

In some embodiments, a flow profile for regulating gas (e.g., by venting a system) in a system (e.g., system 400 of FIG. 4) may be generated such that a resuspension rate of particles in the system may be limited depending on various applications. A flow profile may be generated based on any particle resuspension theory (e.g., Zhang. F., Reeks. M., & Kissane. M. (2013). Particle resuspension in turbulent boundary layers and the influence of non-Gaussian removal forces. *Journal of Aerosol Science*. 58, 103-128).

For example, one or more flow profiles may be generated by generating contour map 500. Contour map 500 may be generated by using critical design parameters in a venting process, such as diameters of diffusers (e.g., diffuser 454 of FIG. 4), diameters of valve tubing, types of particles in the system (e.g., diameter of particle, material of particle, etc.), substrate type (e.g., diameter of substrate, material of substrate, etc. where a substrate may be a wafer, pipe, any surface gas may flow through, etc.), range of flow rate (e.g., mass flow rate) of gas in the system, range of pressure of gas in the system (e.g., pressure variations), etc. in a venting process.

Using any particle resuspension theory and the critical design parameters, the maximum particle resuspension rate (e.g., the maximum percentage of particles that will be resuspended in the system) may be calculated for all possible combinations of gas flow rate and gas pressure.

Contour map 500 may be constructed using the critical design parameters and the calculated maximum particle resuspension rate. For example, contour map 500 may include axis 502 that indicates gas pressure (e.g., pressure in a chamber), axis 504 that indicates gas flow rate, and curves 510 that indicate the maximum particle resuspension rate for ranges of gas pressures and ranges of gas flow rates. Color map 506 may be used to indicate ranges of maximum particle resuspension rate thresholds on contour map 500. For example, curve 512 may illustrate a flow profile for achieving a particle resuspension rate of 0.01%, corresponding to the 0.01% particle resuspension rate gradient of color map 506. Contour map 500 may be used to determine optimal venting profiles (e.g., optimal gas pressure, optimal gas flow rate, etc.) for achieving high venting gas throughput and reduced particle resuspension in the system.

FIG. 6 illustrates an exemplary graph 600 of a flow rate and pressure profile for a range of particle resuspension rates, obtained from the exemplary contour map of FIG. 5, consistent with embodiments of the present disclosure.

Graph 600 may be constructed in a manner similar to contour map 500 described above. For example, graph 600 may be constructed using the critical design parameters and the calculated maximum particle resuspension rate. Graph 600 may include axis 602 that indicates gas pressure (e.g., pressure in a chamber) and axis 604 that indicates gas flow rate. In this example, a maximum particle resuspension rate of 0.01% may be desired in the system. Therefore, graph 600 may include curve 512 that illustrates a flow profile for achieving a maximum particle resuspension rate of 0.01%. Accordingly, region 620 is a region of flow profiles (e.g., gas pressures and gas flow rates) at which a maximum particle resuspension rate is less than or equal to 0.01%.

The embodiments may further be described using the following clauses:

1. A system, comprising:
   a chamber configured to provide a vacuum environment;
   a vent valve; and
   a mass flow controller coupled to the chamber on a first side of the mass flow controller and to the vent valve on a second side of the mass flow controller.
2. The system of clause 1, wherein the vent valve and the mass flow controller are configured to limit a particle resuspension rate to less than 0.1% when the chamber is vented or over-pressured.

3. The system of any one of clauses 1-2, wherein the vent valve and mass flow controller are configured to limit a particle resuspension rate to less than 0.1% when the chamber, having a pressure of less than or equal to $10\times10^{-7}$ Torr, is vented.

4. The system of any one of clauses 1-3, further comprising:

a gas treatment module configured to adjust a characteristic of gas before the gas is vented into the chamber via the vent valve and the mass flow controller.

5. The system of clause 4, wherein the characteristic of the gas indicates a temperature of the gas.

6. The system of any one of clauses 4-5, wherein the characteristic of the gas indicates a mixture of the gas.

7. The system of any one of clauses 1-6, further comprising:

another chamber that has a corresponding vent valve and mass flow controller.

8. The system of clause 7, wherein the corresponding vent valve and the mass flow controller are configured to adjust a gas flow into the another chamber, independently of a gas flow of the chamber.

9. The system of any one of clauses 1-8, wherein the system is an inspection system.

10. The system of any one of clauses 1-9, wherein the vent valve and the mass flow controller are configured to adjust a pressure of the chamber by adjusting a flow rate of a gas provided to the chamber.

11. The system of any one of clauses 1-10, wherein the chamber comprises a diffuser at an inlet of the chamber, the diffuser being configured to limit a particle resuspension rate to less than 0.1%.

12. The system of any one of clauses 1-11, wherein the particle resuspension rate indicates a percentage of particles initially on a surface of the system that are resuspended from the surface.

13. The system of any one of clauses 1-12, wherein the vent valve is configured to provide a vacuum seal.

14. The system of any one of clauses 1-13, wherein the mass flow controller is configured to adjust a flow rate of a gas to enable limiting turbulence of the gas.

15. The system of any one of clauses 1-14, wherein the mass flow controller is configured to adjust a flow rate of a gas based on a flow profile such that a particle resuspension rate is limited.

16. The system of clause 15, wherein the flow profile includes a pressure of the chamber, a flow rate of the gas, and a particle resuspension rate.

17. A flow-line arrangement, comprising:

a mass flow controller configured to:

receive a gas from a vent valve, and provide the gas to a chamber configured to provide a vacuum environment.

18. The flow-line arrangement of clause 17, wherein the vent valve and the mass flow controller are configured to limit a particle resuspension rate to less than 0.1% when the chamber is vented or over-pressured.

19. The flow-line arrangement of any one of clauses 17-18, wherein the vent valve and the mass flow controller are configured to limit a particle resuspension rate to less than 0.1% when the chamber, having a pressure of less than or equal to $10\times10^{-7}$ Torr, is vented.

20. The flow-line arrangement of any one of clauses 17-19, further comprising:

a gas treatment module configured to adjust a characteristic of the gas before the gas is vented into the chamber via the vent valve and the mass flow controller.

21. The flow-line arrangement of clause 20, wherein the characteristic of the gas indicates a temperature of the gas.

22. The flow-line arrangement of any one of clauses 20-21, wherein the characteristic of the gas indicates a mixture of the gas.

23. The flow-line arrangement of any one of clauses 17-22, further comprising:

another chamber that has a corresponding vent valve and mass flow controller.

24. The flow-line arrangement of clause 23, wherein the corresponding vent valve and the mass flow controller are configured to adjust a gas flow into the another chamber, independently of a gas flow of the chamber.

25. The flow-line arrangement of any one of clauses 17-24, wherein the vent valve and the mass flow controller are configured to adjust a pressure of the chamber by adjusting a flow rate of the gas provided to the chamber.

26. The flow-line arrangement of any one of clauses 17-25, wherein the chamber comprises a diffuser at an inlet of the chamber, the diffuser being configured to limit a particle resuspension rate to less than 0.1%.

27. The flow-line arrangement of any one of clauses 17-26, wherein a particle resuspension rate indicates a percentage of particles initially on a surface of a system comprising the flow-line arrangement that are resuspended from the surface.

28. The flow-line arrangement of any one of clauses 17-27, wherein the vent valve is configured to provide a vacuum seal.

29. The flow-line arrangement of any one of clauses 17-28, wherein the mass flow controller is configured to adjust a flow rate of the gas to enable limiting turbulence of the gas.

30. The flow-line arrangement of any one of clauses 17-29, wherein the mass flow controller is configured to adjust a flow rate of a gas based on a flow profile such that the particle resuspension rate is limited.

31. The flow-line arrangement of clause 30, wherein the flow profile includes a pressure of the chamber, a flow rate of the gas, and a particle resuspension rate.

32. A flow-line arrangement, comprising:

a mass flow controller;

a vent valve configured to provide a gas to the mass flow controller; and the mass flow controller is configured to provide the gas to a chamber configured to provide a vacuum environment.

33. The flow-line arrangement of clause 32, wherein the vent valve and the mass flow controller are configured to limit a particle resuspension rate to less than 0.1% when the chamber is vented or over-pressured.

34. The flow-line arrangement of any one of clauses 32-33, wherein the vent valve and the mass flow controller are configured to limit a particle resuspension rate to less than 0.1% when the chamber, having a pressure of less than or equal to $10\times10^{-7}$ Torr, is vented.

35. The flow-line arrangement of any one of clauses 32-34, further comprising:

a gas treatment module configured to adjust a characteristic of the gas before the gas is vented into the chamber via the vent valve and the mass flow controller.

36. The flow-line arrangement of clause 35, wherein the characteristic of the gas indicates a temperature of the gas.
37. The flow-line arrangement of any one of clauses 35-36, wherein the characteristic of the gas indicates a mixture of the gas.
38. The flow-line arrangement of any one of clauses 32-37, further comprising:
another chamber that has a corresponding vent valve and mass flow controller.
39. The flow-line arrangement of clause 38, wherein the corresponding vent valve and the mass flow controller are configured to adjust a gas flow into the another chamber, independently of a gas flow of the chamber.
40. The flow-line arrangement of any one of clauses 32-39, wherein the vent valve and the mass flow controller are configured to adjust a pressure of the chamber by adjusting a flow rate of the gas provided to the chamber.
41. The flow-line arrangement of any one of clauses 32-40, wherein the chamber comprises a diffuser at an inlet of the chamber, the diffuser being configured to limit a particle resuspension rate to less than 0.1%.
42. The flow-line arrangement of any one of clauses 32-41, wherein a particle resuspension rate indicates a percentage of particles initially on a surface of a system comprising the flow-line arrangement that are resuspended from the surface.
43. The flow-line arrangement of any one of clauses 32-42, wherein the vent valve is configured to provide a vacuum seal.
44. The flow-line arrangement of any one of clauses 32-43, wherein the mass flow controller is configured to adjust a flow rate of the gas to enable limiting turbulence of the gas.
45. The flow-line arrangement of any one of clauses 32-44, wherein the mass flow controller is configured to adjust a flow rate of a gas based on a flow profile such that the particle resuspension rate is limited.
46. The flow-line arrangement of clause 45, wherein the flow profile includes a pressure of the chamber, a flow rate of the gas, and a particle resuspension rate.
47. A method, comprising:
venting a chamber configured to provide a vacuum environment by:
providing a gas to a vent valve; and
providing the gas to a mass flow controller that is coupled to the chamber on a first side of the mass flow controller and to the vent valve on a second side of the mass flow controller.
48. The method of clause 47, wherein venting the chamber further comprises limiting, by the vent valve and the mass flow controller, a particle resuspension rate to less than 0.1%.
49. The method of any one of clauses 47-48, wherein venting the chamber further comprises limiting, by the vent valve and mass flow controller, a particle resuspension rate to less than 0.1% when the chamber has a pressure of less than or equal to $10\times10^{-7}$ Torr.
50. The method of any one of clauses 47-49, further comprising:
adjusting, by a gas treatment module, a characteristic of gas before the gas is vented into the chamber via the vent valve and the mass flow controller.
51. The method of clause 50, wherein the characteristic of the gas indicates a temperature of the gas.
52. The method of any one of clauses 50-51, wherein the characteristic of the gas indicates a mixture of the gas.
53. The method of any one of clauses 47-52, further comprising:
venting, by a corresponding vent valve and mass flow controller, another chamber.
54. The method of clause 53, further comprising adjusting, by the corresponding vent valve and the mass flow controller, a gas flow into the another chamber, independently of a gas flow of the chamber.
55. The method of any one of clauses 47-54, further comprising adjusting, by the vent valve and the mass flow controller, a pressure of the chamber by adjusting a flow rate of a gas provided to the chamber.
56. The method of any one of clauses 47-55, further comprising limiting, by a diffuser at an inlet of the chamber, a particle resuspension rate to less than 0.1%.
57. The method of any one of clauses 47-56, wherein the particle resuspension rate indicates a percentage of particles initially on a surface of the system that are resuspended from the surface.
58. The method of any one of clauses 47-57, further comprising providing, by the vent valve, a vacuum seal.
59. The method of any one of clauses 47-58, further comprising adjusting, by the mass flow controller, a flow rate of a gas to enable limiting turbulence of the gas.
60. The method of any one of clauses 47-59, further comprising adjusting, by the mass flow controller, a flow rate of a gas based on a flow profile such that a particle resuspension rate is limited.
61. The method of clause 60, wherein the flow profile includes a pressure of the chamber, a flow rate of the gas, and a particle resuspension rate.
62. A non-transitory computer readable medium that stores a set of instructions that is executable by at least one processor of a computing device to cause the computing device to perform a method, the method comprising:
venting a chamber configured to provide a vacuum environment by:
providing a gas to a vent valve; and
providing the gas to a mass flow controller that is coupled to the chamber on a first side of the mass flow controller and to the vent valve on a second side of the mass flow controller.
63. The non-transitory computer readable medium of clause 62, wherein the set of instructions that is executable by at least one processor of a computing device to cause the computing device to further perform venting the chamber by:
limiting, by the vent valve and the mass flow controller, a particle resuspension rate to less than 0.1%.
64. The non-transitory computer readable medium of any one of clauses 62-63, wherein the set of instructions that is executable by at least one processor of a computing device to cause the computing device to further perform venting the chamber by:
limiting, by the vent valve and mass flow controller, a particle resuspension rate to less than 0.1% when the chamber has a pressure of less than or equal to $10\times10^{-7}$ Torr.
65. The non-transitory computer readable medium of any one of clauses 62-64, wherein the set of instructions that is executable by at least one processor of a computing device to cause the computing device to further perform:

adjusting, by a gas treatment module, a characteristic of gas before the gas is vented into the chamber via the vent valve and the mass flow controller.

66. The non-transitory computer readable medium of clause 65, wherein the characteristic of the gas indicates a temperature of the gas.

67. The non-transitory computer readable medium of any one of clauses 65-66, wherein the characteristic of the gas indicates a mixture of the gas.

68. The non-transitory computer readable medium of any one of clauses 62-67, wherein the set of instructions that is executable by at least one processor of a computing device to cause the computing device to further perform:

venting, by a corresponding vent valve and mass flow controller, another chamber.

69. The non-transitory computer readable medium of clause 68, wherein the set of instructions that is executable by at least one processor of a computing device to cause the computing device to further perform:

adjusting, by the corresponding vent valve and the mass flow controller, a gas flow into the another chamber, independently of a gas flow of the chamber.

70. The non-transitory computer readable medium of any one of clauses 62-69, wherein the set of instructions that is executable by at least one processor of a computing device to cause the computing device to further perform:

adjusting, by the vent valve and the mass flow controller, a pressure of the chamber by adjusting a flow rate of a gas provided to the chamber.

71. The non-transitory computer readable medium of any one of clauses 62-70, wherein the set of instructions that is executable by at least one processor of a computing device to cause the computing device to further perform:

limiting, by a diffuser at an inlet of the chamber, a particle resuspension rate to less than 0.1%.

72. The non-transitory computer readable medium of any one of clauses 62-71, wherein the particle resuspension rate indicates a percentage of particles initially on a surface of the system that are resuspended from the surface.

73. The non-transitory computer readable medium of any one of clauses 62-72, wherein the set of instructions that is executable by at least one processor of a computing device to cause the computing device to further perform:

providing, by the vent valve, a vacuum seal.

74. The non-transitory computer readable medium of any one of clauses 62-73, wherein the set of instructions that is executable by at least one processor of a computing device to cause the computing device to further perform:

adjusting, by the mass flow controller, a flow rate of a gas to enable limiting turbulence of the gas.

75. The non-transitory computer readable medium of any one of clauses 62-74, wherein the set of instructions that is executable by at least one processor of a computing device to cause the computing device to further perform:

adjusting, by the mass flow controller, a flow rate of a gas based on a flow profile such that a particle resuspension rate is limited.

76. The non-transitory computer readable medium of clause 75, wherein the flow profile includes a pressure of the chamber, a flow rate of the gas, and a particle resuspension rate.

It will be appreciated that the embodiments of the present disclosure are not limited to the exact construction that has been described above and illustrated in the accompanying drawings, and that various modifications and changes may be made without departing from the scope thereof.

The invention claimed is:

1. A system, comprising:

a chamber configured to provide a vacuum environment;

a vent valve configured to provide a vacuum seal; and a mass flow controller coupled to the chamber on a first side of the mass flow controller and to the vent valve on a second side of the mass flow controller, the mass flow controller being configured to adjust a flow rate of a gas based on a pre-set flow profile that relates the flow rate, a pressure of the gas in the chamber, and a particle resuspension rate.

2. The system of claim 1, wherein the vent valve and the mass flow controller are configured to limit a particle resuspension rate to less than 0.1% when the chamber is vented or over-pressured.

3. The system of claim 1, wherein the vent valve and mass flow controller are configured to limit a particle resuspension rate to less than 0.1% when the chamber, having a pressure of less than or equal to $10\times10^{-7}$ Torr, is vented.

4. The system of claim 1, further comprising:

a gas treatment module configured to adjust a characteristic of gas before the gas is vented into the chamber via the vent valve and the mass flow controller.

5. The system of claim 4, wherein the characteristic of the gas indicates a temperature of the gas.

6. The system of claim 4, wherein the characteristic of the gas indicates a mixture of the gas.

7. The system of claim 1, further comprising:

another chamber that has a corresponding vent valve and mass flow controller.

8. The system of claim 1, wherein the vent valve and the mass flow controller are configured to adjust a pressure of the chamber by adjusting a flow rate of a gas provided to the chamber.

9. The system of claim 1, wherein the chamber comprises a diffuser at an inlet of the chamber, the diffuser being configured to limit a particle resuspension rate to less than 0.1%.

10. The system of claim 9, wherein the particle resuspension rate indicates a percentage of particles initially on a surface of the system that are resuspended from the surface.

11. The system of claim 1, wherein the mass flow controller is configured to adjust a flow rate of a gas to enable limiting turbulence of the gas.

12. The system of claim 1, wherein the pre-set flow profile is configured to limit the particle resuspension rate to smaller than a predetermined amount.

13. A method, comprising:

venting a chamber configured to provide a vacuum environment by:

providing a gas to a vent valve;

providing the gas to a mass flow controller that is coupled to the chamber on a first side of the mass flow controller and to the vent valve on a second side of the mass flow controller; and diffusing the gas using a diffuser before the gas enters the chamber, the diffuser being configured to spread out the flow of the gas into the chamber.

14. A flow-line arrangement, comprising:

a mass flow controller configured to:

receive a gas from a vent valve, and provide the gas to a chamber configured to provide a vacuum environment; and a gas treatment module configured to adjust a characteristic of the gas before the gas is vented into the chamber via the vent valve and the mass flow controller.

15. The flow-line arrangement of claim 14, wherein the vent valve and the mass flow controller are configured to limit a particle resuspension rate to less than 0.1% when the chamber is vented or over-pressured.

16. The flow-line arrangement of claim 14, wherein the vent valve and the mass flow controller are configured to limit a particle resuspension rate to less than 0.1% when the chamber, having a pressure of less than or equal to $10\times10^{-7}$ Torr, is vented.

17. The flow-line arrangement of claim 14, wherein the characteristic of the gas indicates a temperature of the gas.

* * * * *